(12) United States Patent
Watt et al.

(10) Patent No.: US 7,444,276 B2
(45) Date of Patent: Oct. 28, 2008

(54) HARDWARE ACCELERATION SYSTEM FOR LOGIC SIMULATION USING SHIFT REGISTER AS LOCAL CACHE

(75) Inventors: William Watt, San Jose, CA (US); Henry T. Verheyen, San Jose, CA (US)

(73) Assignee: Liga Systems, Inc., Sunnyvale, CA (US)

( * ) Notice: Subject to any disclaimer, the term of this patent is extended or adjusted under 35 U.S.C. 154(b) by 458 days.

(21) Appl. No.: 11/238,505

(22) Filed: Sep. 28, 2005

(65) Prior Publication Data

US 2007/0073528 A1   Mar. 29, 2007

(51) Int. Cl.
*G06F 17/50* (2006.01)
(52) U.S. Cl. ............................. 703/15; 712/11; 712/24; 326/37
(58) Field of Classification Search ............ 703/14
See application file for complete search history.

(56) References Cited

U.S. PATENT DOCUMENTS

| | | | |
|---|---|---|---|
| 4,736,663 | A | 4/1988 | Wawrzynek et al. |
| 5,093,920 | A | 3/1992 | Agrawal et al. |
| 5,384,275 | A | 1/1995 | Sakashita |
| 5,448,496 | A | 9/1995 | Butts et al. |
| 5,572,710 | A | 11/1996 | Asano et al. |
| 5,655,133 | A | 8/1997 | Dupree et al. |
| 5,663,900 | A | 9/1997 | Bhandari et al. |
| 5,734,581 | A | 3/1998 | Butts et al. |
| 5,737,631 | A | 4/1998 | Trimberger |
| 5,958,048 | A | 9/1999 | Babaian et al. |
| 6,009,256 | A | 12/1999 | Tseng et al. |
| 6,058,492 | A | 5/2000 | Sample et al. |
| 6,097,886 | A | 8/2000 | Dave et al. |

(Continued)

FOREIGN PATENT DOCUMENTS

JP        64-26969        1/1989

(Continued)

OTHER PUBLICATIONS

Haug et al, "Behavioral Emulation of Synthesized RT-level Descriptions Using VLIW Architectures", Proceedings of the 1998 Ninth International Workshop on Rapid System Prototyping, Jun. 3-5, 1998.*

(Continued)

*Primary Examiner*—Paul L Rodriguez
*Assistant Examiner*—Mary C Jacob
(74) *Attorney, Agent, or Firm*—Fenwick & West LLP (57) ABSTRACT

A logic simulation processor stores in a shift register intermediate values generated during the logic simulation. The simulation processor includes multiple processor units and an interconnect system that communicatively couples the processor units to each other. Each of the processor units includes a processor element configurable to simulate at least a logic gate, and a shift register associated with the processor element. The shift register includes multiple entries to store the intermediate values, and is coupled to receive the output of the processor element. Each of the processor units further includes one or more multiplexers for selecting one of the entries of the shift register as outputs to be coupled to the interconnect system. Each of the processor units may further include a local memory for storing data from, and loading the data to, the simulation processor.

29 Claims, 8 Drawing Sheets

U.S. PATENT DOCUMENTS

| | | | |
|---|---|---|---|
| 6,298,366 | B1 | 10/2001 | Gatherer et al. |
| 6,377,912 | B1 | 4/2002 | Sample et al. |
| 6,385,757 | B1 | 5/2002 | Gupta et al. |
| 6,523,055 | B1 | 2/2003 | Yu et al. |
| 6,530,014 | B2 | 3/2003 | Alidina et al. |
| 6,553,479 | B2 | 4/2003 | Mirsky et al. |
| 6,604,065 | B1 | 8/2003 | Blomgren et al. |
| 6,678,645 | B1 | 1/2004 | Rajsuman et al. |
| 6,678,646 | B1 | 1/2004 | McConnell et al. |
| 6,684,318 | B2 | 1/2004 | DeHon et al. |
| 6,745,317 | B1 | 6/2004 | Mirsky et al. |
| 6,766,445 | B2 * | 7/2004 | Schlansker et al. ......... 712/241 |
| 7,080,365 | B2 | 7/2006 | Broughton et al. |
| 7,107,432 | B2 * | 9/2006 | De Vries et al. ............. 712/24 |
| 2001/0020224 | A1 | 9/2001 | Tomita |
| 2001/0025238 | A1 | 9/2001 | Kitajima et al. |
| 2003/0105617 | A1 | 6/2003 | Cadambi et al. |
| 2004/0054518 | A1 | 3/2004 | Altman et al. |
| 2005/0256696 | A1 | 11/2005 | Gooding et al. |
| 2006/0089829 | A1 | 4/2006 | Gooding et al. |

FOREIGN PATENT DOCUMENTS

| | | |
|---|---|---|
| JP | 2001-222564 | 8/2001 |
| JP | 2001-249824 | 9/2001 |

OTHER PUBLICATIONS

Lewis et al, "A Programmable Hardware Accelerator for Compiled Electrical Simulation", 25th ACM/IEEE Design Automation Conference, 1988.*

Abke, J. et al., "A New Placement Method for Direct Mappings into LUT-Based FPGAs. In International Conference on Field Programmable Logic and Applications (FPL 2001)," Aug. 2001, pp. 27-36.

Abramovici, M. et al., "A Logic Simulation Machine," IEEE Transactions on Computer-Aided Design of Integrated Circuits and Sytems, Apr. 1983, pp. 82-94, vol. CAD-2, No. 2.

"ADC-RC1000 Virtex Reconfigurable Computing PCI Card" Alpha Data Parallel System, Online! May 20, 2002, pp. 1-3 XP002275523.

Babb, J. et al., "Logic Emulation with Virtual Wires," In IEEE Transactions on CAD of Integrated Circuits and Systems, Jun. 1997.

Babb, J. et al., "Virtual Wires: Overcoming Pin Limitations in FPGA-Based Logic Emulators," In Proceedings of the IEEE Workshop on FPGAs for Custom Computing Machines, Apr. 1993.

Cadambi, S. et al., "Efficient Place and Route for Pipeline Reconfigurable Architecture," IEEE, 2000, pp. 423-429.

Cadambi et al., "A Fast, Inexpensive and Scalable Hardware Acceleration Technique for Functional Simulation" Proceedings of Design Automation Conference 2002, Jun. 10, 2002, pp. 570-575.

"The Challenge of Design Complexity: The Power of Simulation Acceleration and Emulation" [online] [Retrieved on Jan. 15, 2004] Retrieved from the Internet<URL:http://www.quickturn.com/products/palladium.htm.

Cong, J. et al., "FlowMap: An Optimal Technology Mapping Algorithm for Delay Optimization in Lookup-Table based FPGA Design," In IEEE Transactions on CAD, Jan. 1994, pp. 1-12.

Corno, F. et al., "RT-level ITC99 Benchmarks and First ATPG Results" IEEE Design and Test of Computers, Jul. 2000, pp. 44-53.

Goldstein, S.C. et al., "Piperench: A Coprocessor for Streaming Multimedia Acceleration," The 26th Annual International Symposium on Computer Architecture, May 1999, pp. 28-39.

Hauck, S. et al., "Logic Partition Orderings for Multi-FPGA Systems," ACM/SIGDA International Symposium on Field Programmable Gate Arrays, Feb. 1995, pp. 32-38.

Hauck, S: "The Roles of FPGAs in Reprogrammable Systems" Proceedings of the IEEE, Apr. 1998, pp. 615-638, vol. 86, No. 4.

Lo, W et al., "Hardware Emulation Board Bases on FPGA's and Programmable Interconnections," Proceedings of the Fifth International Workshop on Rapid System Prototyping, Jun. 21, 1994, pp. 126-130.

Mulpuri, C. et al., Runtime and Quality Tradeoffs in FPGA Placement and Routing, International Symposium on Field Programmable Gate Arrays, Feb. 2001, pp. 29-36.

Partial European Search Report, EP 03251837, May 5, 2004, 3 pages.

Sangiovanni-Vincentelli, A. et al., "Synthesis Methods for Field-Programmable Gate Arrays," Proceedings of the IEEE, Jul. 1993, pp. 1057-1083, vol. 81, No. 7.

Semiconductor Industry Association. International technology roadmap for semiconductors, 1999, [online] [Retrieved on Jan. 15, 2004] Retrieved from the Internet<URL:http://public.itrs.net>.

Shriver, E., et al., "Ravel: Assigned-Delay Compiled-Code Logic Simulation," International Conference on Computer-Aided Design (ICCAD), 1992, pp. 364-368.

"Sometimes, size does matter", 2001, [online] [Retrieved on Jan. 15, 2004] Retrieved from the Internet<URL:http://www.quickturn.com/products/CoBALTUltra.htm>.

Spillinger, I. et al., "Improving the Performance of a Switch-Level Simulator Targeted for a Logic Simulation Machine," IEEE Transactions on Computer-Aided Design, Jul. 1986, pp. 396-404, vol. CAD-5, No. 3.

Trimberger, S. et al., "Scheduling Designs into a Time-Multiplexed FPGA," Proceedings of the 1998 ACM/SIGDA Sixth International Symposium on Field Programmable Gate Arrays, Feb. 1998.

Trimberger, S. et al., "A Time-Multiplexed FPGA," IEEE Symposium on FPGAs for Custom Computing Machines (FCCM) 1997, Feb. 1997.

Weinhardt et al.: "Memory access optimization for reconfigurable systems" IEEE Proceedings Computers and Digital Techniques, May 2001, pp. 105-112, p. 102, column 1-p. 106, column 1, vol. 148, No. 3.

Westgate, K. et al. "Reducing Logic Verification Time with Cycle Simulation," 2000, http://www.quickturn.com/tech/cbs.htm.

"What is Cycle-Based Simulation," [online] [Retrieved on Jan. 15, 2004] Retrieved from the Internet<URL:http://www.quickturn.com/products/speedsim.htm>.

Cadambi, S. et al., "A Fast, Inexpensive and Scalable Hardware Acceleration Technique for Functional Simulation," Proceedings of Design Automation Conference, Jun. 10, 2002, pp. 570-575.

Mano et al., Logic and Computer Design Fundamentals, 2001, Second Edition, Prentice Hall, pp. 27-33.

Buchholz, T. et al. "Behavioral Emulation of Synthesized RT-Level Descriptions Using VLIW Architectures," Proceedings of the 1998 Ninth International Workshop on Rapid System Prototyping, Jun. 3-5, 1998, 6 pages.

Budiu, M. et al., "Fast Compilation for Pipelined Reconfigurable Fabrics," Carnegie Mellon University, ACM, 1999, pp. 195-205.

Cadambi, S. et al., "Managing Pipeline-Reconfigurable FPGAs," Carnegie Mellon University, ACM, 1998.

Carlson, S., "A New Generation of Verification Acceleration," Jun. 2000. http://www.tharas.com.

"XC4000XLA/XV Field Programmable Gate Arrays—Product Description DS015 (V1.3)," Xilinx, Oct. 18, 1999, 14 pages.

Goldstein, S.C. et al., "PipeRench: A Reconfigurable Architecture and Compiler," IEEE Computer, 2000, pp. 70-77.

* cited by examiner

HARDWARE ACCELERATION SYSTEM FOR LOGIC SIMULATION USING SHIFT REGISTER AS LOCAL CACHE

BACKGROUND OF THE INVENTION

1. Field of the Invention

The present invention relates generally to VLIW (Very Long Instruction Word) processors, including for example simulation processors that may be used in hardware acceleration systems for logic simulation. More specifically, the present invention relates to the use of shift registers as the local cache in such processors.

2. Description of the Related Art

Simulation of a logic design typically requires high processing speed and a large number of operations due to the large number of gates and operations and the high speed of operation typically present in the logic design for modern semiconductor chips. One approach for logic simulation is software-based logic simulation (i.e., software simulators) where the logic is simulated by computer software executing on general purpose hardware. Unfortunately, software simulators typically are very slow. Another approach for logic simulation is hardware-based logic simulation (i.e., hardware emulators) where the logic of the semiconductor chip is mapped on a dedicated basis to hardware circuits in the emulator, and the hardware circuits then perform the simulation. Unfortunately, hardware emulators typically require high cost because the number of hardware circuits in the emulator increases according to the size of the simulated logic design.

Still another approach for logic simulation is hardware-accelerated simulation. Hardware-accelerated simulation typically utilizes a specialized hardware simulation system that includes processor elements configurable to emulate or simulate the logic designs. A compiler is typically provided to convert the logic design (e.g., in the form of a netlist or RTL (Register Transfer Language) to a program containing instructions which are loaded to the processor elements to simulate the logic design. Hardware-accelerated simulation does not have to scale proportionally to the size of the logic design, because various techniques may be utilized to break up the logic design into smaller portions and then load these portions of the logic design to the simulation processor. As a result, hardware-accelerated simulators typically are significantly less expensive than hardware emulators. In addition, hardware-accelerated simulators typically are faster than software simulators due to the hardware acceleration produced by the simulation processor.

However, hardware-accelerated simulators generally require that instructions be loaded onto the simulation processor for execution and the data path for loading these instructions can be a performance bottleneck. For example, a simulation processor might include a large number of processor elements, each of which includes an addressable register as a local cache to store intermediate values generated during the logic simulation. The register requires an input address signal to determine the location of the particular memory cell at which the intermediate value is to be stored. This input address signal typically is included as part of the instruction sent to the processor element, which can significantly increase the instruction length and exacerbate the instruction bandwidth bottleneck.

For example, in order to select one memory cell out of a local cache register that has $2^N$ memory cells (i.e., the "depth" of the register is $2^N$, e.g., the "depth" is 256 for N=8), an input address signal of at least N bits is required. If these bits are included as part of the instruction, then the instruction length will be increased by at least N bits for each processor unit. Assuming that this architecture is available on a per-processor unit basis (non-shared local cache), if the simulation processor contains n processor elements, then a total n×N bits is added to the overall size of the instruction word (e.g., for n=128 and N=8, this amounts to an additional 1024 bits). On the hardware side, additional circuitry will be needed to allow the register to be addressable. This adds to the cost, size and complexity of the simulation processor.

Therefore, there is a need for a simulation processor using a different type of local cache memory requiring fewer bits in the instructions that are used by the simulation processor. There is also a need for a simulation processor obviating or at least reducing the need for additional circuitry, such as input multiplexers to support the addressability of registers of the simulation processor.

SUMMARY OF THE INVENTION

The present invention provides a simulation processor for performing logic simulation of logic gates, where intermediate values generated by the simulation processor during the logic simulation are stored in shift registers. The simulation process includes a plurality of processor units and an interconnect system (e.g., a crossbar) that communicatively couples the processor units to each other. As compared to an addressable register, the use of a shift register as local cache reduces the instruction length and also simplifies the hardware design of the simulation processor.

Each of the processor units includes a processor element configurable to simulate at least one of the logic gates, and a shift register associated with the processor element and including a plurality of entries to store intermediate values during operation of the processor element. The shift register is coupled to receive an output of the processor element. Each of the processor units may optionally include any number of multiplexers selecting entries of the shift register in response to selection signals. The selected entries may then be routed to various locations, for example to the inputs of other processor units via the interconnect system. Each of the processor units may optionally include a local memory associated with the shift register for storing data from the shift register and loading the data to the shift register, in some sense acting as overflow memory for the shift register.

In various embodiments of the present invention, each of the processor units further comprises one or more of the following: a first multiplexer selecting either the output of the processor element or a last entry of the shift register in response to a first selection signal as input to the shift register, a second multiplexer selecting one of the entries of the shift register in response to a second selection signal, a third multiplexer selecting another one of the entries of the shift register in response to a third selection signal, a fourth multiplexer selecting either the output of the processor element or an output of the local memory in response to a fourth selection signal, a fifth multiplexer selecting either an output of the second multiplexer or the last entry of the shift register in response to a fifth selection signal, and a sixth multiplexer selecting either an output of the third multiplexer or an output of the fourth multiplexer in response to the fifth selection signal.

In a second embodiment of the present invention, each of the processor units further comprises a first multiplexer selecting either a mid-entry of the shift register or a last entry of the shift register in response to a first selection signal, and a second multiplexer selecting either an output of the processor element or an output of the first multiplexer, in response to a second selection signal, as an input to the shift register. The processor unit can further include a local memory associated with the shift register for storing data from the processor element and loading the data to the processor element, a third multiplexer selecting one of the entries of the shift register in response to a third selection signal, a fourth multiplexer selecting another one of the entries of the shift register in response to a fourth selection signal having one more bit than the third selection signal, a fifth multiplexer selecting either the output of the processor element or an output of the local memory in response to a fifth selection signal, a sixth multiplexer selecting either an output of the third multiplexer or the output of the first multiplexer in response to the first selection signal, and a seventh multiplexer selecting either an output of the fourth multiplexer or an output of the fifth multiplexer in response to the first selection signal.

The simulation processor of the present invention has the advantage that it may reduce the instruction length, because the shift register does not require any input address signals. Also, input multiplexers are not necessarily required to select cells of the shift register. The simulation process of the present invention has the additional advantage that the shift register is interconnected with the local memory in such a way that a store mode and a load mode for the processor element are non-blocking with respect to an evaluation mode. That is, the store mode and the load mode may be performed simultaneously with the evaluation mode.

Other aspects of the invention include systems corresponding to the devices described above, applications for these devices and systems, and methods corresponding to all of the foregoing. Another aspect of the invention includes VLIW processors that use shift registers as local cache but for purposes other than logic simulation of semiconductor chips.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF EMBODIMENTS

Figure 1:
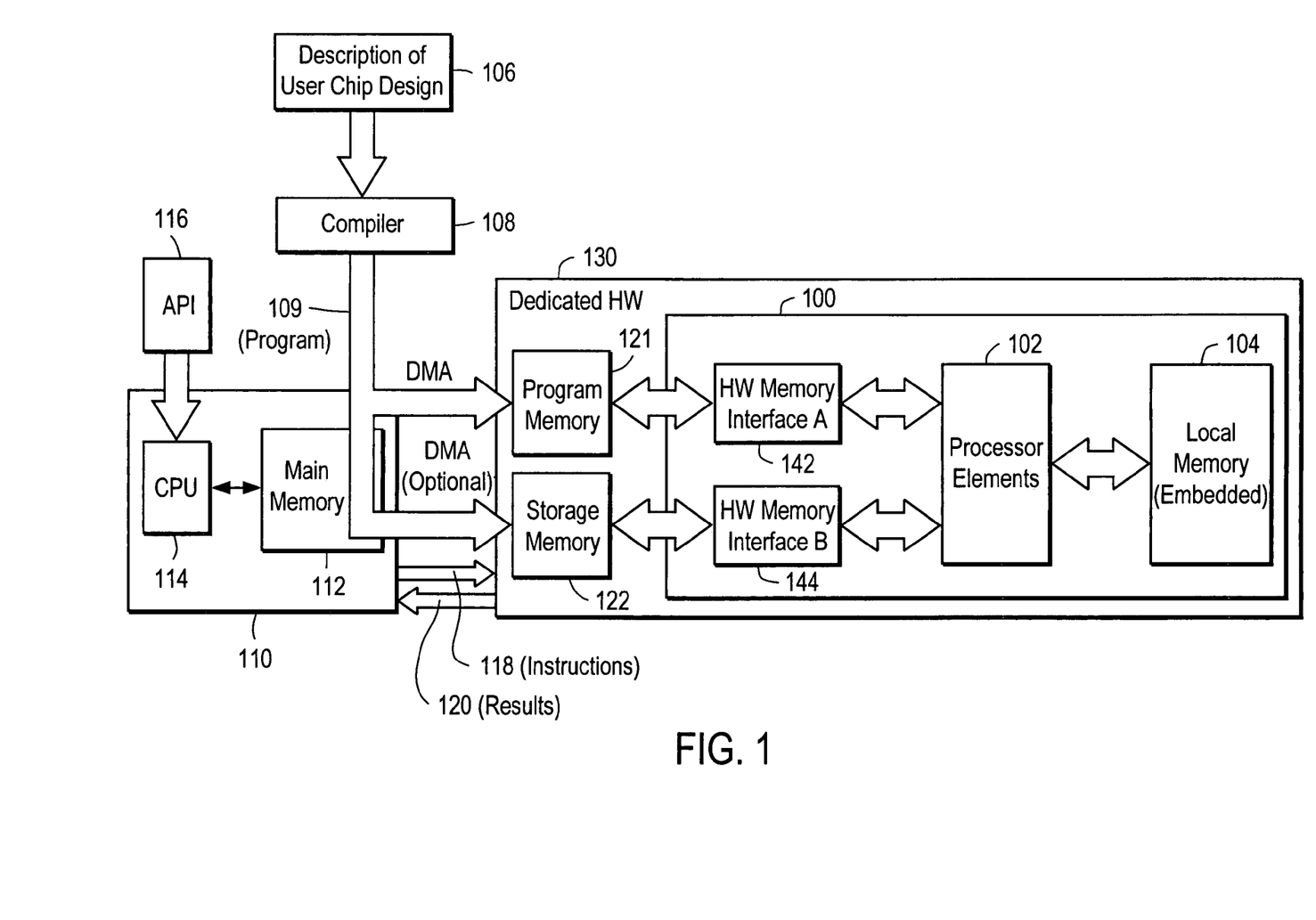
FIG. 1 is a block diagram illustrating a hardware-accelerated logic simulation system according to one embodiment of the present invention.

FIG. 1 is a block diagram illustrating a hardware accelerated logic simulation system according to one embodiment of the present invention. The logic simulation system includes a dedicated hardware (HW) simulator 130, a compiler 108, and an API (Application Programming Interface) 116. The computer 110 includes a CPU 114 and a main memory 112. The API 116 is a software interface by which the host computer 110 controls the simulation processor 100. The dedicated HW simulator 130 includes a program memory 121, a storage memory 122, and a simulation processor 100 that includes processor elements 102, an embedded local memory 104, a hardware (HW) memory interface A 142, and a hardware (HW) memory interface B 144.

The system shown in FIG. 1 operates as follows. The compiler 108 receives a description 106 of a user chip or logic design, for example, an RTL (Register Transfer Language) description or a netlist description of the logic design. The description 106 typically represents the logic design as a directed graph, where nodes of the graph correspond to hardware blocks in the design. The compiler 108 compiles the description 106 of the logic design into a program 109, which maps the logic design 106 against the processor elements 102 to simulate the logic design 106. The program 109 may also include the test environment (testbench) to simulate the logic design 106 in addition to representing the chip design 106 itself. For further descriptions of example compilers 108, see United States Patent Application Publication No. US 2003/0105617 A1, "Hardware acceleration system for logic simulation," published on Jun. 5, 2003, which is incorporated herein by reference. See especially paragraphs 191-252 and the corresponding figures. The instructions in program 109 are stored in main memory 112.

The simulation processor 100 includes a plurality of processor elements 102 for simulating the logic gates of the logic design 106 and a local memory 104 for storing instructions and data for the processor elements 102. In one embodiment, the HW simulator 130 is implemented on a generic PCI-board using an FPGA (Field-Programmable Gate Array) with PCI (Peripheral Component Interconnect) and DMA (Direct Memory Access) controllers, so that the HW simulator 130 naturally plugs into any general computing system 110. The simulation processor 100 forms a portion of the HW simulator 130. Thus, the simulation processor 100 has direct access to the main memory 112 of the host computer 110, with its operation being controlled by the host computer 110 via the API 116. The host computer 110 can direct DMA transfers between the main memory 112 and the memories 121, 122 on the HW simulator 130, although the DMA between the main memory 112 and the memory 122 may be optional.

The host computer 110 takes simulation vectors (not shown) specified by the user and the program 109 generated by the compiler 108 as inputs, and generates board-level instructions 118 for the simulation processor 100. The simulation vector (not shown) includes values of the inputs to the netlist 106 that is simulated. The board-level instructions 118 are transferred by DMA from the main memory 112 to the memory 121 of the HW simulator 130. The memory 121 also stores results 120 of the simulation for transfer to the main memory 112. The memory 122 stores user memory data, and can alternatively (optionally) store the simulation vectors (not shown) or the results 120. The memory interfaces 142, 144 provide interfaces for the processor elements 102 to access the memories 121, 122, respectively. The processor elements 102 execute the instructions 118 and, at some point, return simulation results 120 to the computer 110 also by DMA. Intermediate results may remain on-board for use by subsequent instructions. Executing all instructions 118 simulates the entire netlist 106 for one simulation vector. A more detailed discussion of the operation of a hardware-accelerated simulation system such as that shown in FIG. 1 can be found in United States Patent Application Publication No. US 2003/0105617 A1 published on Jun. 5, 2003, which is incorporated herein by reference in its entirety.

Figure 2:
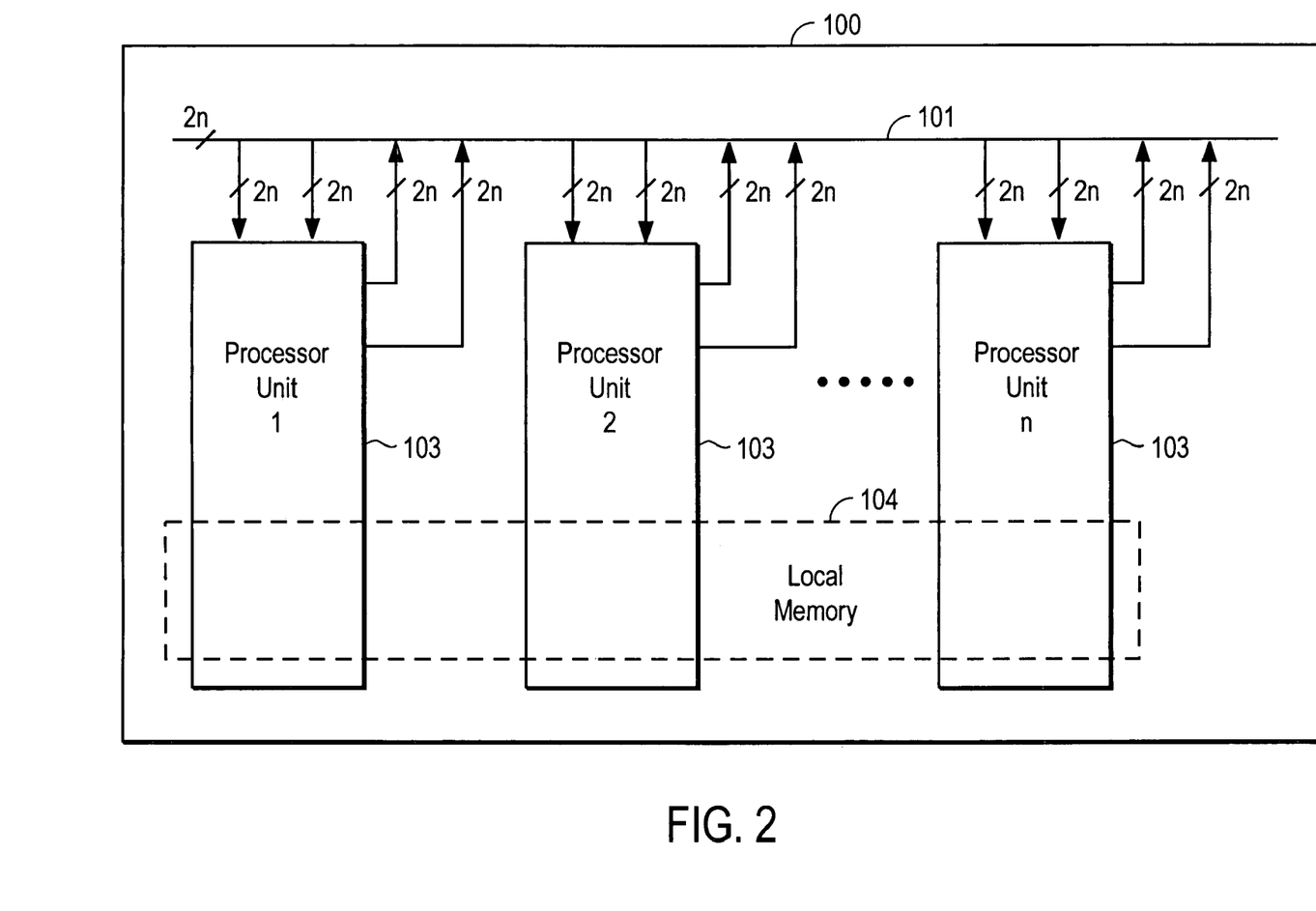
FIG. 2 is a block diagram illustrating a simulation processor in the hardware-accelerated logic simulation system according to one embodiment of the present invention.

FIG. 2 is a block diagram illustrating the simulation processor 100 in the hardware-accelerated logic simulation system according to one embodiment of the present invention. The simulation processor 100 includes n processor units 103 (Processor Unit 1, Processor Unit 2, ... Processor Unit n) that communicate with each other through an interconnect system 101. In this example, the interconnect system is a non-blocking crossbar. Each processor unit can take up to two inputs from the crossbar (denoted by the inbound arrows with slash and notation "2n") and can generate up to two outputs for the crossbar (denoted by the outbound arrows with slash and notation "2n"). Thus, the crossbar is a 2n×2n crossbar that allows each input of each processor unit 103 to be coupled to any output of any processor unit 103. In this way, an intermediate value calculated by one processor unit can be made available for use as an input for calculation by any other processor unit. For a simulation processor comprised of n processor units, each having 2 inputs, 2n signals must be selectable in the crossbar for a non-blocking architecture. If each processing unit is identical, they must each supply 2 variables into the crossbar. This yields a 2n×2n crossbar. Blocking architectures, non-homogeneous architectures, optimized architectures (for specific design styles), or shared architectures (in which processor units either share the address bits, or share either the input or the output lines into the crossbar), etc. would not have to follow a 2n×2n crossbar. Many other combinations of the crossbar are therefore also possible.

Figure 3:
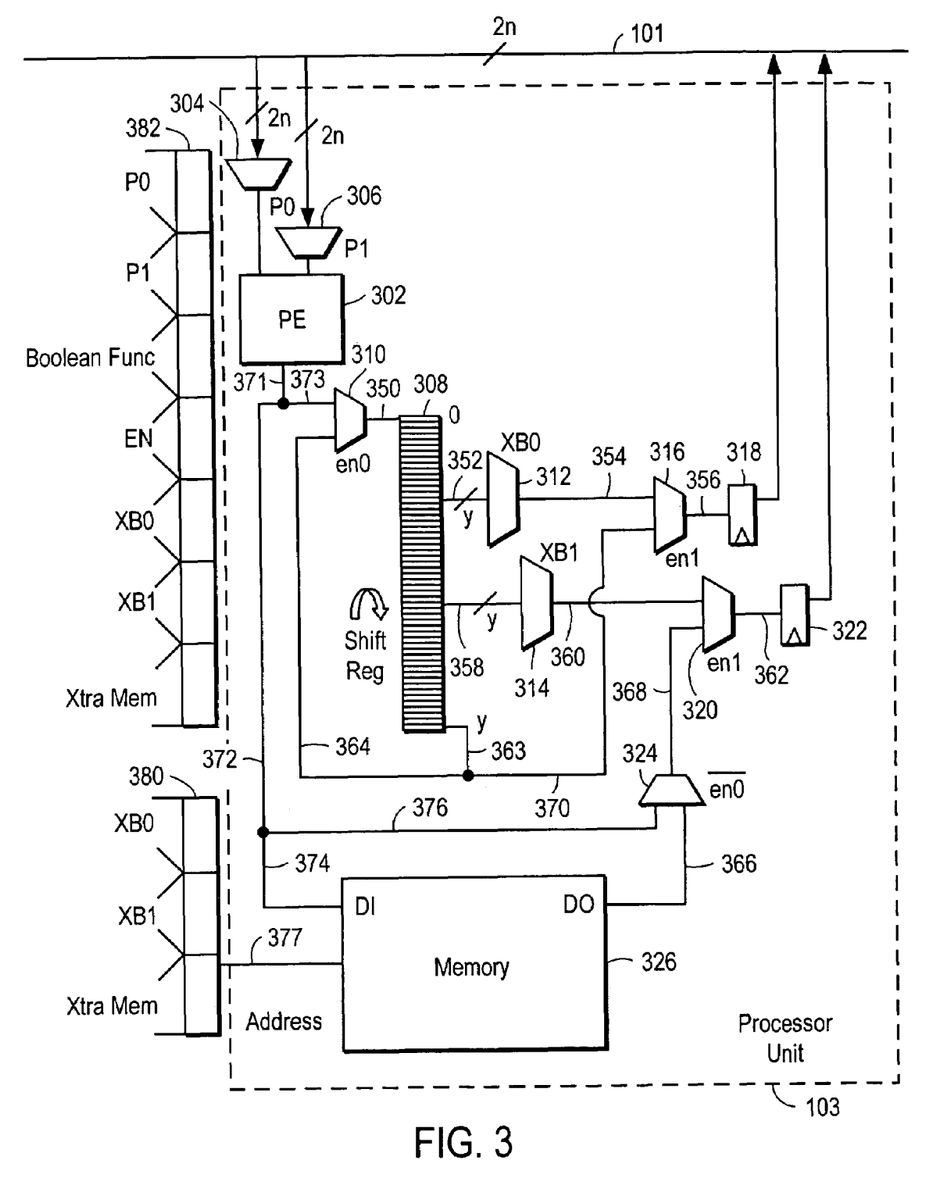
FIG. 3 is a circuit diagram illustrating a single processor unit of the simulation processor according to a first embodiment of the present invention.
Figure 4:
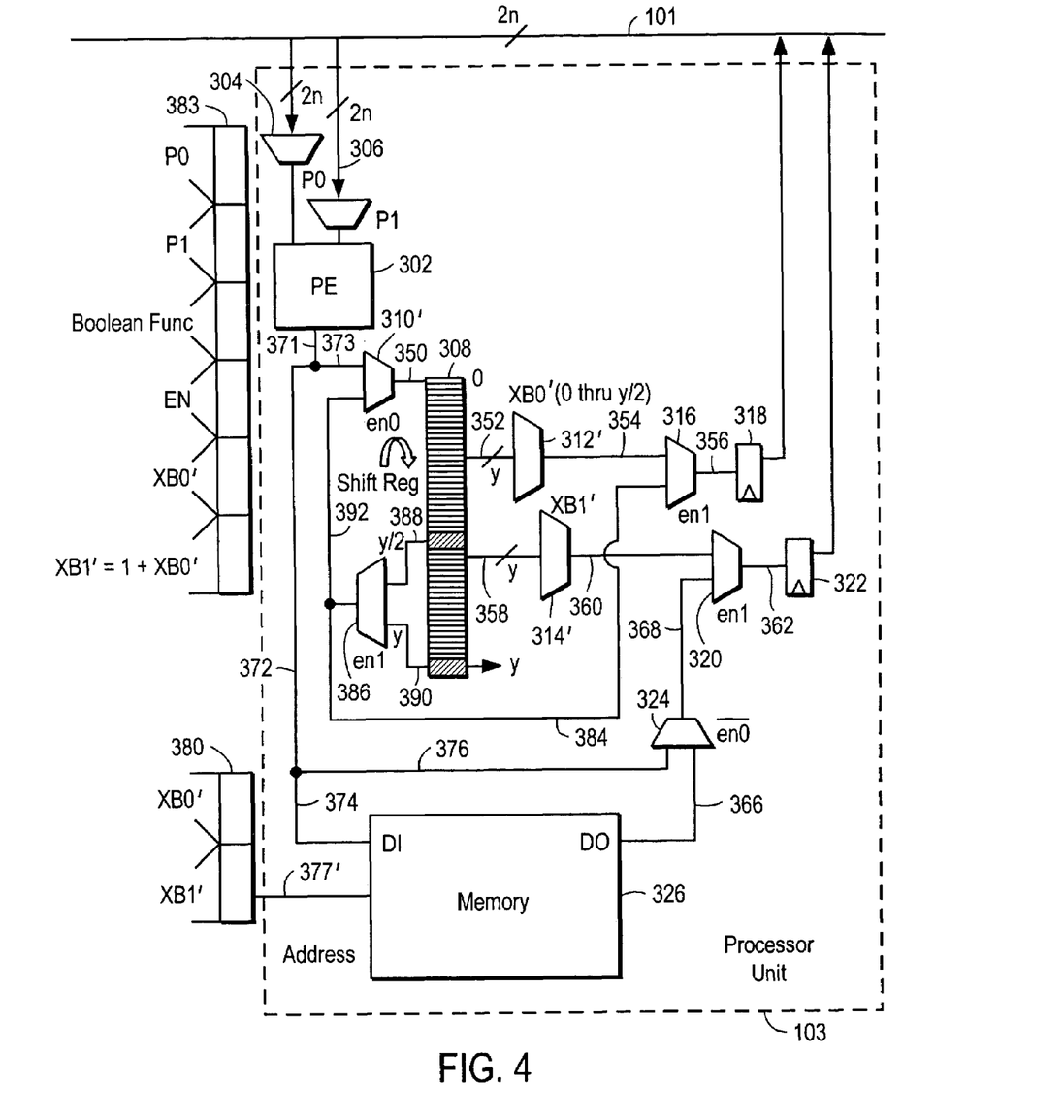
FIG. 4 is a circuit diagram illustrating a single processor unit of the simulation processor in the hardware accelerated logic simulation system according to a second embodiment of the present invention.

As will be shown in more detail with reference to FIGS. 3 and 4, each of the processor units 103 includes a processor element (PE), a shift register, and a corresponding part of the local memory 104 as its memory. Therefore, each processor unit 103 can be configured to simulate at least one logic gate of the logic design 106 and store intermediate or final simulation values during the simulation.

FIG. 3 is a circuit diagram illustrating a single processor unit 103 of the simulation processor 100 in the hardware accelerated logic simulation system according to a first embodiment of the present invention. Each processor unit 103 includes a processor element (PE) 302, a shift register 308, an optional memory 326, multiplexers 304, 306, 310, 312, 314, 316, 320, 324, and flip flops 318, 322. The processor unit 103 is controlled by instructions 118 (shown as 382 in FIG. 3). The instruction 382 has fields P0, P1, Boolean Func, EN, XB0, XB1, and Xtra Mem in this example. Let each field X have a length of X bits. The instruction length is then the sum of P0, P1, Boolean Func, EN, XB0, XB1, and Xtra Mem in this example. A crossbar 101 interconnects the processor units 103. The crossbar 101 has 2n bus lines, if the number of PEs 302 or processor units 103 in the simulation processor 100 is n and each processor unit has two inputs and two outputs to the crossbar. In a 2-state implementation, n represents n signals that are binary (either 0 or 1). In a 4-state implementation, n represents n signals that are 4-state coded (0, 1, X or Z) or dual-bit coded (e.g., 00, 01, 10, 11). In this case, we also refer to the n as n signals, even though there are actually 2n electrical (binary) signals that are being connected. Similarly, in a three-bit encoding (8-state), there would be 3n electrical signals, and so forth.

The PE 302 is a configurable ALU (Arithmetic Logic Unit) that can be configured to simulate any logic gate with two or fewer inputs (e.g., NOT, AND, NAND, OR, NOR, XOR, constant 1, constant 0, etc.). The type of logic gate that the PE 302 simulates depends upon Boolean Func, which programs the PE 302 to simulate a particular type of logic gate. The number of bits in Boolean Func is determined in part by the number of different types of unique logic gates that the PE 302 is to simulate. For example, if each of the inputs is 2-state logic (i.e., a single bit, either 0 or 1) and the output is also 2-state, then the corresponding truth table is a 2×2 truth table (2 possible values for each input), yielding 2×2=4 possible entries in the truth table. Each entry in the truth table can take one of two possible values (2 possible values for each output). Thus, there are a total of 2^4=16 possible truth tables that can be implemented. If every truth table is implemented, the truth tables are all unique, and Boolean Func is coded in a straight-forward manner, then Boolean Func would require 4 bits to specify which truth table (i.e., which logic function) is being implemented. Correspondingly, the number Boolean Func would equal 4 bits in this example. Note that it is also possible to have Boolean Func of only 5 bits for 4-state logic with modifications to the circuitry.

The multiplexer 304 selects input data from one of the 2n bus lines of the crossbar 101 in response to a selection signal P0 that has P0 bits, and the multiplexer 306 selects input data from one of the 2n bus lines of the crossbar 101 in response to a selection signal P1 that has P1 bits. The PE 302 receives the input data selected by the multiplexers 304, 306 as operands, and performs the simulation according to the configured logic function as indicated by the Boolean Func signal.

In the example of FIG. 3, each of the multiplexers 304, 306 for every processor unit 103 can select any of the 2n bus lines. The crossbar 101 is fully non-blocking and exhaustively connective. This is not required in all implementations. For example, some of the processor units 103 may be designed to have more limited connectivity, with possible connection to only some and not all of the other processor units 103, or to only some and not all of the output lines from other processor units 103. Different input lines to the same processor unit may also have different connectivity. For example, multiplexer 304 might be designed to have full connectivity to any of the 2n bus lines, but multiplexer 306 might be designed to have more limited connectivity. In addition, the selections signals P0 and P1 are represented here as distinct signals, one for selecting the input to multiplexer 304 and one for selecting the input to multiplexer 306. This also is not required. The information for selecting inputs may be combined into a single field (call it P01) or even combined with other fields. For example, this may allow more efficient coding of the instruction, thus reducing the instruction length.

The shift register 308 has a depth of y (has y memory cells), and stores intermediate values generated while the PEs 302 in the simulation processor 100 simulate a large number of gates of the logic design 106 in multiple cycles. Using a shift register 308 rather than a general register has the advantage that no input address signal is needed to select a particular memory cell of the shift register 308. FIG. 3 shows a single shift register 308 of depth y, but alternate embodiments can use more than one shift register. In one approach, a single shift register 308 is reproduced, for example to allow more memory access on the output side. The duplicate shift registers may have different depths. For example, only the top half of the shift register may be reproduced if there is much more activity in the top half (which stores fresher data) than in the bottom half (which stores staler data).

In the embodiment shown in FIG. 3, a multiplexer 310 selects either the output 371-373 of the PE 302 or the last entry 363-364 of the shift register 308 in response to bit en0 of the signal EN, and the first entry of the shift register 308 receives the output 350 of the multiplexer 308. Selection of output 371 allows the output of the PE 302 to be transferred to the shift register 308. Selection of last entry 363 allows the last entry 363 of the shift register 308 to be recirculated to the top of the shift register 308, rather than dropping off the end of the shift register 308 and being lost. In this way, the shift register 308 is refreshed. The multiplexer 310 is optional and the shift register 308 can receive input data directly from the PE 302 in other embodiments. In addition, although in FIG. 3 the first entry of the shift register 308 is coupled to receive the output 371-373 of the PE 302 through the multiplexer 310, the circuit of FIG. 3 may be modified such that any one of the entries of the shift register 308 can receive the output 371-373 of the PE 302 directly or through the multiplexer 310. There can also be more than one entry point to shift register 308 and/or to additional shift registers.

On the output side of the shift register 308, the multiplexer 312 selects one of they memory cells of the shift register 308 in response to a selection signal XB0 that has XB0bits as one output 352 of the shift register 308. Similarly, the multiplexer 314 selects one of they memory cells of the shift register 308 in response to a selection signal XB1 that has XB1bits as another output 358 of the shift register 308. Depending on the state of multiplexers 316 and 320, the selected outputs can be routed to the crossbar 101 for consumption by the data inputs of processor units 103. This particular example shows two shift register outputs 352 and 358, each of which can select from anywhere in the shift register. Alternate embodiments can use different numbers of outputs, different accesses to the shift register (as will be discussed in FIG. 4) and different routings. For example, it is not required that every output from the shift register 308 be routable to the crossbar 101. Some outputs may be strictly routed internally within the processor unit 103. For another example, although the embodiment of FIG. 3 uses one shift register 308 and the output of the shift register 308 is accessed by two multiplexers 312, 314, it is also possible to have two separate shift registers and have each of two separate multiplexers access the output of one of the two separate multiplexers. In such case, the contents of the data stored in the two shift registers would be replicated to be identical. Also, the signals for controlling the two separate multiplexers may have different lengths.

The memory 326 has an input port DI and an output port DO for storing data to permit the shift register 308 to be spilled over due to its limited size. In other words, the data in the shift register 308 may be loaded from and/or stored into the memory 326. The number of intermediate signal values that may be stored is limited by the total size of the memory 326. Since memories 326 are relative inexpensive and fast, this scheme provides a scalable, fast and inexpensive solution for logic simulation. The memory 326 is addressed by an address signal 377 made up of XB0, XB1 and Xtra Mem. Note that signals XB0 and XB1 were also used as selection signals for multiplexers 312 and 314, respectively. Thus, these bits have different meanings depending on the remainder of the instruction. These bits are shown twice in FIG. 3, once as part of the overall instruction 382 and once 380 to indicate that they are used to address the memory 326.

The input port DI is coupled to receive the output 371-372-374 of the PE 302. Note that an intermediate value calculated by the PE 302 that is transferred to the shift register 308 will drop off the end of the shift register 308 after y shifts (assuming that it is not recirculated). Thus, a viable alternative for intermediate values that will be used eventually but not before y shifts have occurred, is to transfer the value from PE 302 directly to the memory 326, bypassing the shift register 308 entirely (although the value could be simultaneously made available to the crossbar 101 via path 371-372-376-368-362). In a separate data path, values that are transferred to shift register 308 can be subsequently moved to memory 326 by outputting them from the shift register 308 to crossbar 101 (via data path 352-354-356 or 358-360-362) and then re-entering them through a PE 302 to the memory 326. Values that are dropping off the end of shift register 308 can be moved to memory 326 by a similar path 363-370-356.

The output port DO is coupled to the multiplexer 324. The multiplexer 324 selects either the output 371-372-376 of the PE 302 or the output 366 of the memory 326 as its output 368 in response to the complement (~en0) of bit en0 of the signal EN. In this example, signal EN contains two bits: en0 and en1. The multiplexer 320 selects either the output 368 of the multiplexer 324 or the output 360 of the multiplexer 314 in response to another bit en1 of the signal EN. The multiplexer 316 selects either the output 354 of the multiplexer 312 or the final entry 363, 370 of the shift register 308 in response to another bit en1 of the signal EN. The flip-flops 318, 322 buffer the outputs 356, 362 of the multiplexers 316, 320, respectively, for output to the crossbar 101.

Referring to the instruction 382 shown in FIG. 3, the fields can be generally divided as follows. P0 and P1 determine the inputs from the crossbar to the PE 302. EN is primarily a two-bit opcode that will be discussed in further detail below. Boolean Func determines the logic gate to be implemented by the PE 302. XB0, XB1 and Xtra Mem either determine the outputs of the processor unit to the crossbar 101, or determine the memory address 377 for memory 326. Note that Xtra Mem is not a required bit, and Xtra Mem=0 is also a valid condition.

In one embodiment, four different operation modes (Evaluation, No-Operation, Store, and Load) can be triggered in the processor unit 103 according to the bits en1 and en0 of the signal EN, as shown below in Table 1:

TABLE 1

| | Op Codes for field EN | |
|---|---|---|
| Mode | en1 | en0 |
| Evaluation | 0 | 0 |
| No-Op | 0 | 1 |
| Load | 1 | 0 |
| Store | 1 | 1 |

FIGS. 3A-3D are modified circuit diagrams illustrating each of these modes. In these diagrams, non-selected data paths have been deleted in order to more clearly show operation of the processor unit during the mode.

Figure 3A:
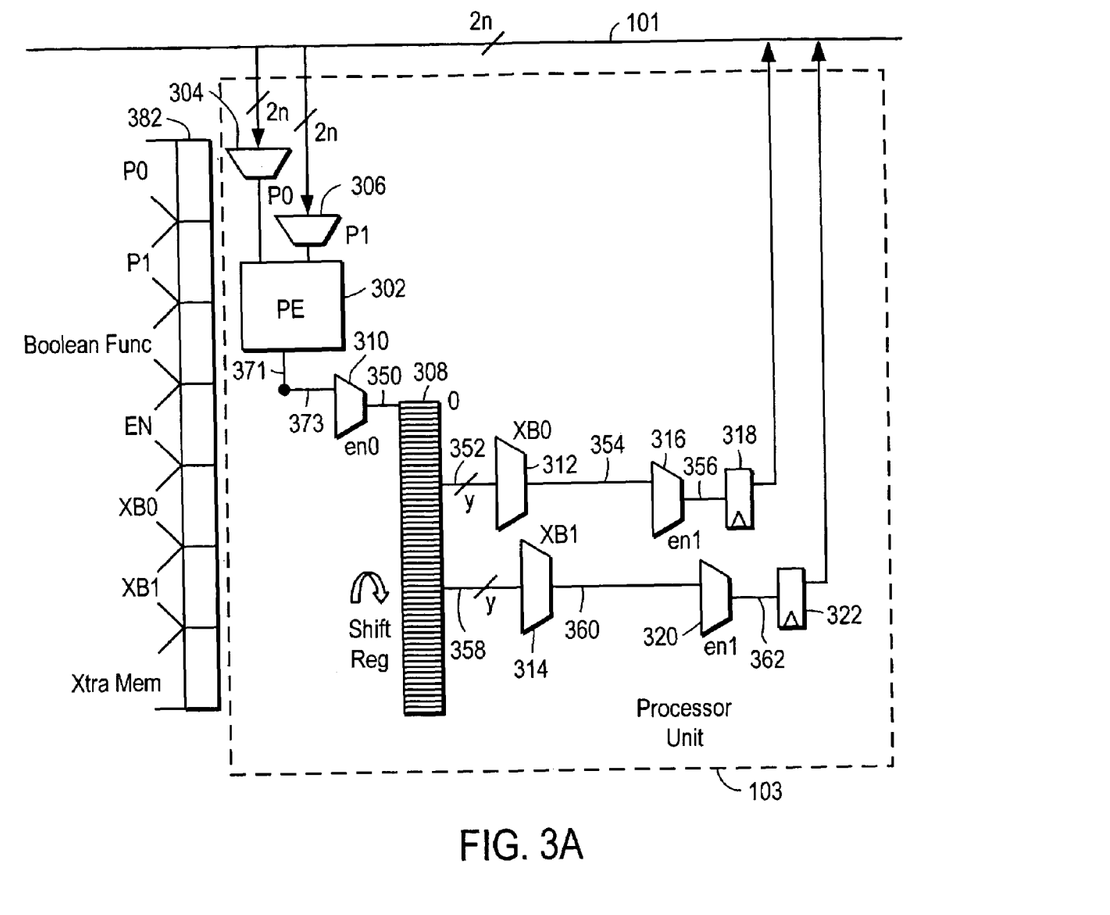
FIG. 3A is a modified circuit diagram of the processor unit of FIG. 3, illustrating an evaluation mode for the processor unit.

FIG. 3A illustrates an evaluation mode (en1=0 and en0=0) of the simulation processor 100. The primary function of this mode is for the PE 302 to simulate a logic gate (i.e., to receive two inputs and perform a specific logic function on the two inputs to generate an output). The multiplexer selections shown in FIG. 3A are chosen to provide data paths that are likely to be used in connection with a logic gate evaluation. Specifically, (i) bit en0=0 causes the multiplexer 310 to select the output 371-373 of the PE 302, (ii) bit en1=0 causes the multiplexer 316 to select the output 354 of the multiplexer 312 and also causes the multiplexer 320 to select the output 360 of the multiplexer 314, and (iii) XB0 and XB1 are used as inputs to multiplexers 312 and 314 rather than addresses to memory 326.

Therefore, during the evaluation mode, the PE 302 simulates a logic gate based on the input operands output by the multiplexers 304 and 306, stores the intermediate value in the shift register 308, which is eventually output to the crossbar 101 for use by other processor units 103. At the same time, multiplexers 312 and 314 can select entries from the shift register 308 for use as inputs to processor units on the next cycle.

Figure 3B:
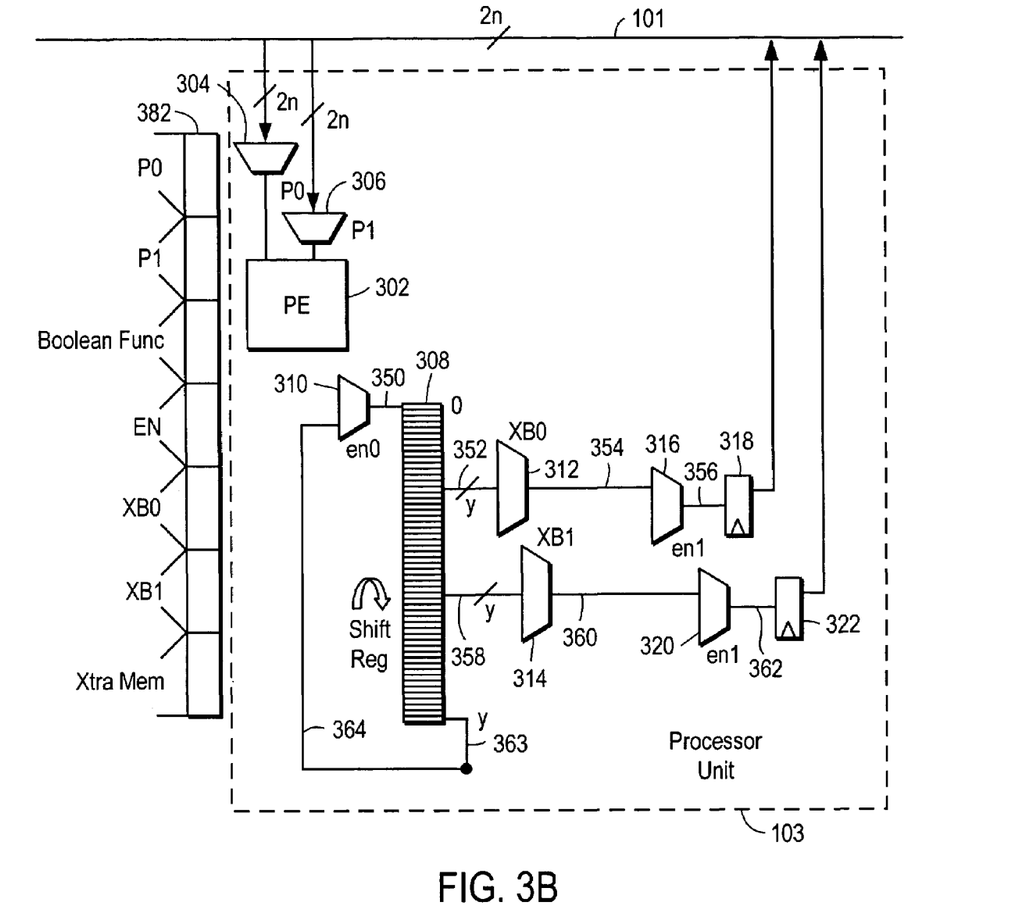
FIG. 3B is a modified circuit diagram of the processor unit of FIG. 3, illustrating a no-operation mode for the processor unit.

FIG. 3B illustrates a no-operation mode (en1=0 and en0=1) of the simulation processor 100. In this mode, the PE 302 performs no operation. The mode may be useful, for example, if other processor units are evaluation functions based on data from this shift register 308, but this PE is idling. The multiplexer selections are chosen as follows: (i) bit en0=1 causes the multiplexer 310 to select the last entry 363-364 of the shift register 308, (ii) bit en1=0 causes the same selections as in FIG. 3A, and (iii) XB0 and XB1 are used as inputs to multiplexers 312 and 314 rather than addresses to memory 326.

During the no-operation mode, the PE 302 does not simulate any gate, while the shift register 308 is refreshed so that the last entry of the shift register 308 is recirculated to the first entry of the shift register 308. At the same time, data can be read out from the shift register 308 via paths 352-354-356 and 358-360-362.

Figure 3C:
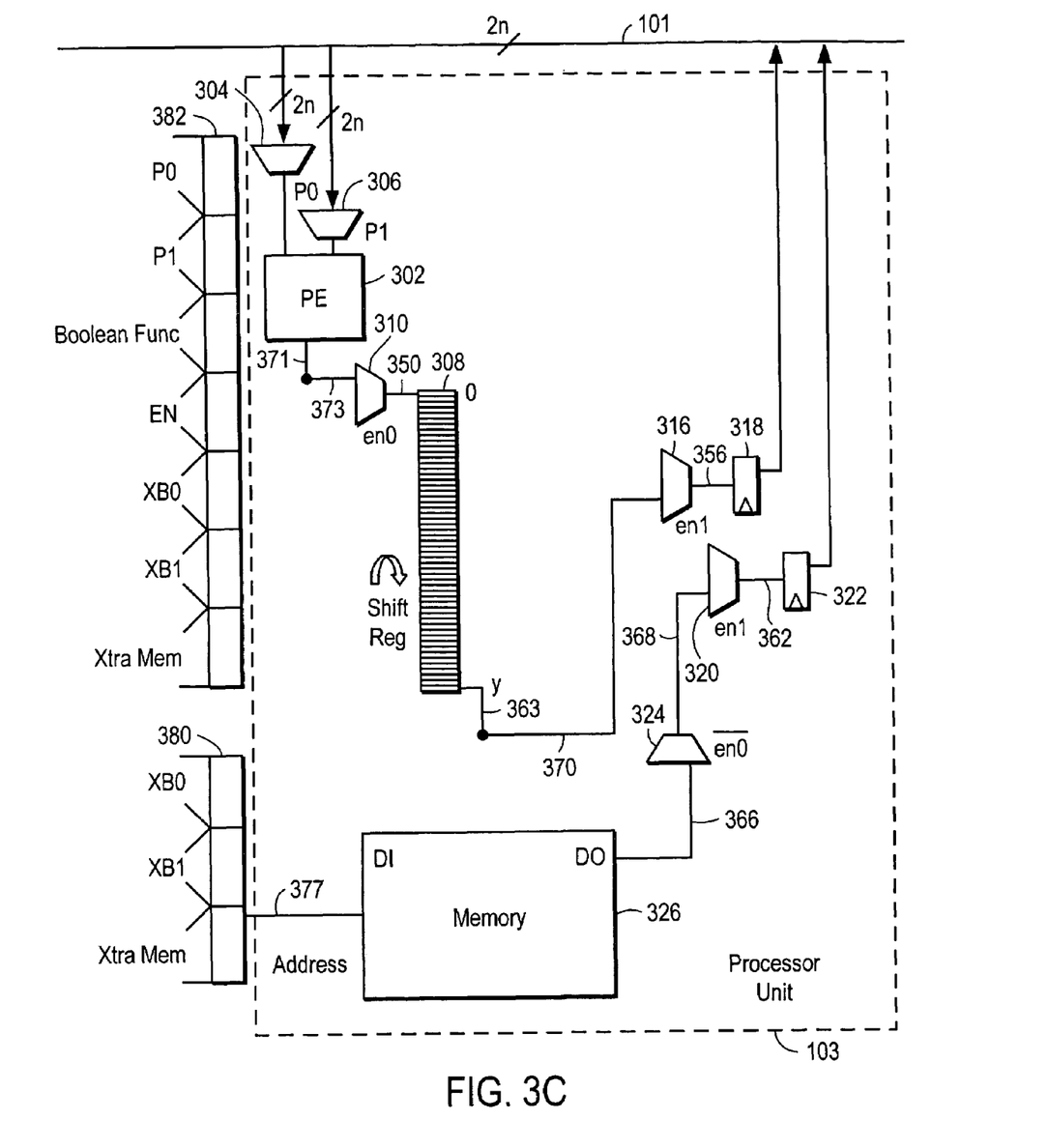
FIG. 3C is a modified circuit diagram of the processor unit of FIG. 3, illustrating a load mode for the processor unit.

FIG. 3C illustrates a load mode (en1=1 and en0=0) of the simulation processor 100. The primary function of this mode is to load data from local memory 326. The multiplexer selections are chosen as follows: (i) bit en1=1 causes the multiplexer 320 to select the output 368 of the multiplexer 324, and bit ~en0=1 causes the multiplexer 324 to select the output 366 of the memory 326, (ii) bit en0=1 causes the multiplexer 310 to select the output 371-373 of the PE 302, (iii) bit en1=1 causes the multiplexer 316 to select the last entry 363-370 of the shift register 308. Also, the local memory 326 is addressed by the memory address signal 377 (fields XB0, XB1 and Xtra Mem) to select a particular memory cell as the memory output 366.

Note that during this mode, data can be loaded from the memory 326 to the crossbar 101 for use by processor units and, at the same time, the PE 302 can perform an evaluation of a logic function and store the result in the shift register 308. In many alternate approaches, evaluation by the PE and load from memory cannot be performed simultaneously, as is the case here. In this example, loading data from local memory 326 does not block operation of the PE 302.

Figure 3D:
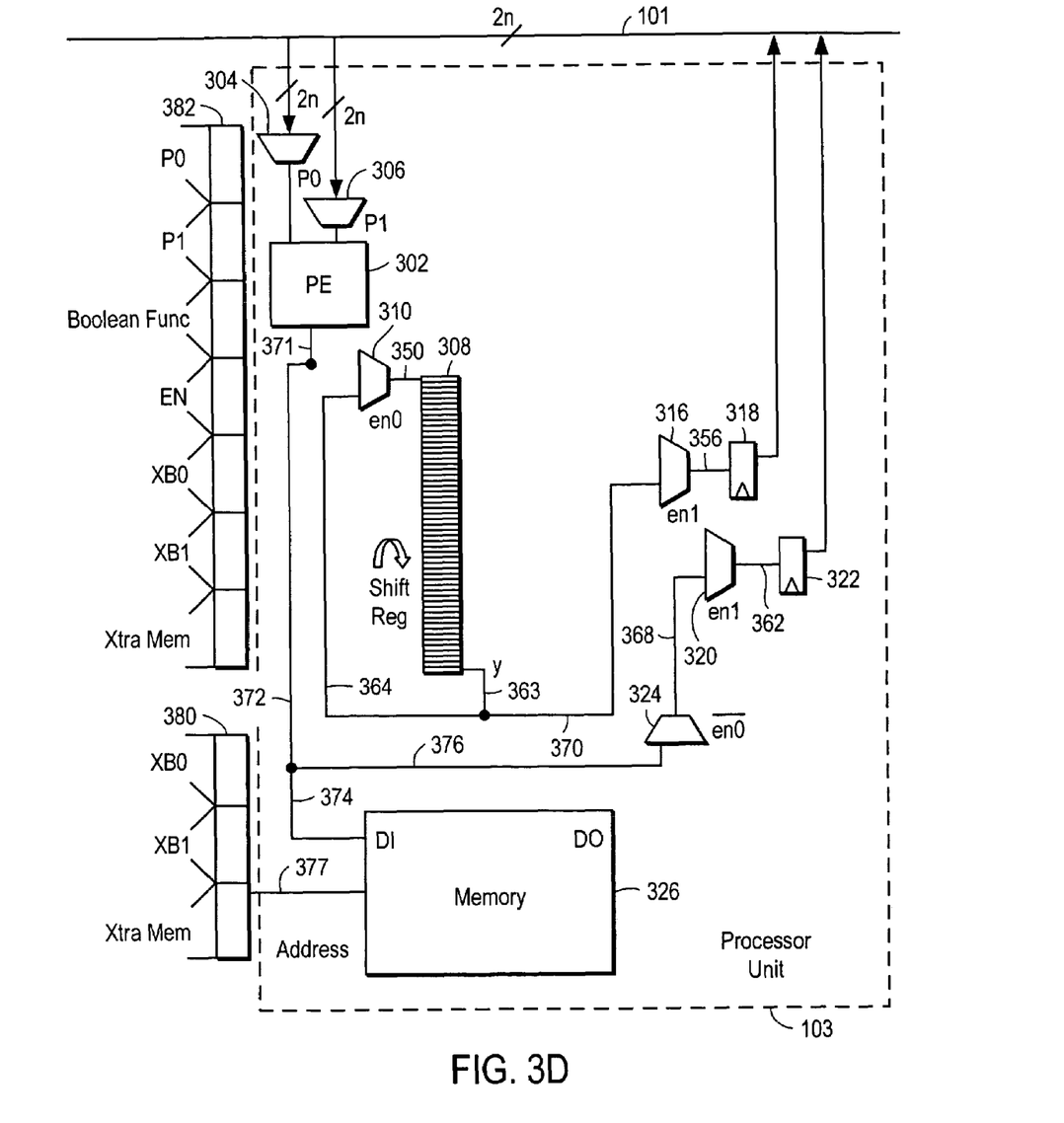
FIG. 3D is a modified circuit diagram of the processor unit of FIG. 3, illustrating a store mode for the processor unit.

FIG. 3D illustrates a store mode (en1=1 and en0=1) of the simulation processor 100. The primary function of this mode is to store data to local memory 326. In this mode, the local memory 326 is addressed by the memory address signal 377 to select a particular memory cell in which the output data 371-372-374 of the PE 302 is stored. Therefore, during the store mode, the output data 371-372-374 of the PE 302 can be stored into the local memory 326. The multiplexers are configured as follows: (i) bit en1=1 causes the multiplexer 320 to select the output 368 of the multiplexer 324, and bit ~en0=0 causes the multiplexer 324 to select the output 371-372-376 of the PE 302, (ii) bit en1=1 also causes the multiplexer 316 to select the last entry 363-370 of the shift register 308, and (iii) bit en0=1 causes the multiplexer 310 to select the last entry 363-364 of the shift register 308.

The store mode is also non-blocking of the operation of the PE 302. The PE 302 can evaluation a logic function and the resulting value can be immediately stored to local memory 326. It can also be made available to the crossbar 101 via path 371-372-376-368-362. The last entry in the shift register 308 can also be recirculated and also made available to the crossbar via path 370-356.

One advantage of the architecture shown in FIG. 3 is that the load and store modes do not block operation of the PE 302. That is, the load mode might be more appropriately referred to as a load-and-evaluation mode, and the store mode might be more appropriately referred to as a store-and-evaluation mode. This is important for logic simulation. Logic simulation requires the simulation of a certain number of gates. Hence, the more quickly evaluations can be performed, the faster the logic simulation can be completed. Supporting load/store and evaluation in a single cycle is a significant speedup compared to approaches in which load/store requires one cycle and evaluation requires a separate cycle.

FIG. 4 is a circuit diagram illustrating a single processor unit 103 of the simulation processor in the hardware accelerated logic simulation system according to a second embodiment of the present invention. Each processor unit 103 includes a processor element (PE) 302, a shift register 308, a memory 326, multiplexers 304, 306, 310, 312', 314', 316, 320, 324, 386 and flip flops 318, 322. The processor unit 103 is controlled by instructions 383, which have fields P0, P1, Boolean Func, EN, XB0', XB1' (XB1'=XB0'+1), and Xtra Mem (optional). A crossbar 101 interconnects each of the processor units 103. The crossbar 101 has 2n bus lines, if the number of PEs 302 or processor units 103 in the simulation processor 100 is n and each processor unit has two inputs and two outputs to the crossbar.

The processor unit shown in FIG. 4 is the same as the one shown in FIG. 3, with one significant difference. In FIG. 3, multiplexer 312 could select any of the y entries in shift register 308, as could multiplexer 314. In FIG. 4, while multiplexer 314' can select any of the y entries in shift register 308, multiplexer 312' can only select from the top half of the shift register. Multiplexer 312' can address only y/2 entries.

In more detail, the multiplexer 386 selects either the mid-entry (y/2) 388 or the last entry (y) 390 of the shift register 308 in response to bit en1, although the multiplexer 386 can be modified to select any two entries of the shift register 308 in other embodiments. The output 363 of multiplexer 386 plays a role similar to signal 363 in FIG. 3. Thus, multiplexer 310 selects either the output 371-373 of the PE 302 or the output 363-364 of multiplexer 368 in response to bit en0, and the first entry of the shift register 308 receives the output 350 of the multiplexer 310. Additionally, the multiplexer 312' selects one of the memory cells (0 through y/2) of the shift register 308 in response to a selection signal XB0', and the multiplexer 314' selects one of they memory cells of the shift register 308 in response to a selection signal XB1'. The memory 326 is addressed by an address signal 377 that includes the bits XB0', XB1'.

This approach shown in FIG. 4 may result in better utilization of the fields XB0', XB1'. For example, referring first to FIG. 3, assume that y is a power of 2 and XB0=XB1=log (base 2) y. Further assume that Xtra Mem has 1 bit, so Xtra Mem=1 and there are $2^{(2 XB0+1)}$ possible addresses for the local memory. Now consider a design for FIG. 4 which uses the same size local memory but a shift register with depth 2y instead of y. Use prime to indicate the quantities for FIG. 4. Then, XB0'=XB0 because multiplexer 312' only addresses half of the shift register so the same number of bits are needed as in FIG. 3 to address the entire shift register. However, XB1'=XB1+1 since multiplexer 314' addresses twice as many shift register entries. Accordingly, the Xtra Mem field is not needed in FIG. 4. Instead of using fields XB0, XB1 and Xtra Mem of FIG. 3, fields XB0' and XB1' can be used in FIG. 4. Thus, FIG. 4 results in an instruction that has the same length as FIG. 3 (i.e., no additional bits are needed), a local memory of the same size but a shift register with twice the depth. This is achieved by utilizing the bits in the Xtra Mem field for shift register addressing in addition to local memory addressing. In FIG. 3, these bits were used only for local memory addressing and were wasted during shift register addressing.

The multiplexer 386 selects either the mid-entry 388 or the last entry 390 during various modes. In the example of FIG. 4, the multiplexer 386 is configured so that the shift register 308 is refreshed by recirculating the mid-entry 388 to the top of the shift register 308 in the no-operation mode (en1=0 and en0=1) via path 388-363-364-350, the last entry 390 is output to the crossbar 101 during the load mode (en1=1 and en0=0) via path 390-363-370-356, and the last entry 390 is both recirculated to the top of the shift register 308 and output to the crossbar 101 during the store mode (en1=1 and en0=1).

The present invention has the advantage that the simulation processor may use fewer bits in the instructions for the simulation processor, because the shift register does not require input address signals. Additional input multiplexers are not needed to address the shift register, thereby simplifying and reducing the number of components in the circuitry of the simulation processor. The present invention has the additional advantage that the shift register 308 is interconnected with the local memory 326 in such a way that the store mode and load mode are non-blocking, i.e., the store mode and the load mode may be performed simultaneously with the evaluation mode of the simulation processor.

Although the present invention has been described above with respect to several embodiments, various modifications can be made within the scope of the present invention. For example, the shift register 308 may be used with the PE 302 in many different configurations, and changes in the surrounding circuitry of the shift register 308 and PE 302 are still within the scope of the present invention. Additionally, although the present invention is described in the context of PEs that are the same, alternate embodiments can use different types of PEs and different numbers of PEs. The PEs also are not required to have the same connectivity or the same size or configuration of shift register. PEs may also share resources. For example, more than one PE may write to the same shift register and/or local memory. For example, two PEs may share a single local memory. The reverse is also true, a single PE may write to more than one shift register and/or local memory.

As another example, the instructions 382, 383 shown in FIGS. 3 and 4 show distinct fields for P0, P1, etc. and the overall operation of the instruction set was described in the context of four primary operational modes. This was done for clarity of illustration. In various embodiments, more sophisticated coding of the instruction set may result in instructions with overlapping fields or fields that do not have a clean one-to-one correspondence with physical structures or operational modes. One example is given in the use of fields XB0, XB1 and Xtra Mem. These fields take different meanings depending on the rest of the instruction. In addition, symmetries or duality in operation may also be used to reduce the instruction length.

In another aspect, the simulation processor 100 of the present invention can be realized in ASIC (Application-Specific Integrated Circuit) or FPGA (Field-Programmable Gate Array) or other types of integrated circuits. It also need not be implemented on a separate circuit board or plugged into the host computer 110. There may be no separate host computer 110. For example, referring to FIG. 1, CPU 114 and simulation processor 100 may be more closely integrated, or perhaps even implemented as a single integrated computing device.

Although the present invention is described in the context of logic simulation for semiconductor chips, the VLIW processor architecture presented here can also be used for other applications. For example, the processor architecture can be extended from single bit logic simulation to fixed width computing (e.g., integer programming), to floating point computing. The same architecture can be applied to other types of applications, such as finite element modeling, DNA sequencing, three-dimensional rendering, database computation, MRI (magnetic resonance imaging), etc. Applications that have inherent parallelism are good candidates for this processor architecture. Accordingly, the disclosure of the present invention is intended to be illustrative, but not limiting, of the scope of the invention, which is set forth in the following claims.

What is claimed is:

1. A simulation processor for performing logic simulation of a logic design including a plurality of logic gates, the simulation processor comprising:
   an interconnect system; and
   a plurality of processor units communicatively coupled to each other via the interconnect system, wherein each of at least two of the processor units includes:
      a processor element configurable to simulate at least one of the logic gates;
      a shift register associated with the processor element and including a plurality of entries to store intermediate values during operation of the processor element, the shift register coupled to receive an output of the processor element; and
      one or more multiplexers coupled between the shift register and the interconnect system, each such multiplexer for selecting one of the entries of the shift register in response to a selection signal and further for transferring the selected entry to the interconnect system, and
      wherein the output of the processor element is coupled to the shift register without an intervening latch, and the shift register is coupled to the interconnect system with an intervening latch.

2. The simulation processor of claim 1, wherein the one or more multiplexers comprises two or more multiplexers.

3. The simulation processor of claim 2, wherein at least one of the multiplexers cannot address an entire depth of the shift register.

4. The simulation processor of claim 1, wherein during an evaluation mode of the processor element during which the processor element simulates said at least one logic gate, the output of the processor element is coupled to the shift register, and the one or more multiplexers couple the shift register to the interconnect system.

5. The simulation processor of claim 1, wherein during a no-operation mode of the processor element during which the processor element does not simulate any logic gate, the one or more multiplexers couple the shift register to the interconnect system.

6. The simulation processor of claim 1, wherein during the no-operation mode, the shift register is refreshed.

7. The simulation processor of claim 1, wherein each of the at least two processor units further comprises:

a local memory associated with the processor element for storing data from the simulation processor and loading data to the simulation processor.

8. The simulation processor of claim 7, wherein during a load mode of the processor element, the local memory is coupled to the interconnect system without passing through the shift register or the processor element.

9. The simulation processor of claim 7, wherein during a load mode of the processor element, the local memory is coupled to the interconnect system, and the processor element simulates said at least one logic gate.

10. The simulation processor of claim 9, wherein during the load mode, the output of the processor element is coupled to the shift register.

11. The simulation processor of claim 7, wherein during a store mode, the output of the processor element is coupled to the local memory without passing through the shift register.

12. The simulation processor of claim 7, wherein during a store mode, the processor element simulates said at least one logic gate and the output of the processor element is coupled to the local memory.

13. The simulation processor of claim 12, wherein during the store mode, the output of the processor element is also coupled to the interconnect system.

14. The simulation processor of claim 7, wherein depending on the mode of the processor element, the output of the processor element is configurable to be coupled to the shift register and/or the local memory.

15. The simulation processor of claim 7, wherein the processor unit further comprises:
another multiplexer for selecting either the output of the processor element or an output of the local memory in response to a selection signal.

16. The simulation processor of claim 1, wherein each of the at least two processor units further comprises:
a local memory associated with the processor element for storing data from the simulation processor and loading data to the simulation processor, wherein at least some of the bits in the selection signals for the one or more multiplexers are also used to address the local memory.

17. The simulation processor of claim 1, wherein each of the at least two processor units further comprises another multiplexer for either coupling an output of the processor element to the shift register or refreshing the shift register in response to a selection signal.

18. A simulation processor for performing logic simulation of a logic design including a plurality of logic gates, the simulation processor comprising:
an interconnect system; and
a plurality of processor units communicatively coupled to each other via the interconnect system, wherein each of at least two of the processor units includes:
a processor element configurable to simulate at least one of the logic gates;
a shift register associated with the processor element and including a plurality of entries to store intermediate values during operation of the processor element, the shift register coupled to receive an output of the processor element;
a local memory associated with the processor element for storing data from the simulation processor and loading data to the simulation processor;
a first multiplexer either selecting the output of the processor element as input to the shift register or refreshing the shift register, in response to a first selection signal;
a second multiplexer selecting one of the entries of the shift register in response to a second selection signal; and
a third multiplexer selecting another one of the entries of the shift register in response to a third selection signal.

19. The simulation processor of claim 18, wherein each of the at least two processor units further comprises:
a fourth multiplexer selecting either the output of the processor element or an output of the local memory in response to a fourth selection signal;
a fifth multiplexer selecting either an output of the second multiplexer or the last entry of the shift register in response to a fifth selection signal; and
a sixth multiplexer selecting either an output of the third multiplexer or an output of the fourth multiplexer in response to the fifth selection signal.

20. The simulation processor of claim 19, wherein during an evaluation mode of the processor element during which the processor element simulates said at least one logic gate:
the first selection signal causes the first multiplexer to select the output of the processor element;
the fifth selection signal causes the fifth multiplexer to select the output of the second multiplexer; and
the fifth selection signal causes the sixth multiplexer to select the output of the third multiplexer.

21. The simulation processor of claim 19, wherein during a no-operation mode of the processor element during which the processor element performs no simulation operation:
the first selection signal causes the first multiplexer to refresh the shift register;
the fifth selection signal causes the fifth multiplexer to select the output of the second multiplexer; and
the fifth selection signal causes the sixth multiplexer to select the output of the third multiplexer.

22. The simulation processor of claim 19, wherein during a load mode of the processor element during which data from the output of the local memory is loaded into the simulation processor:
the first selection signal causes the first multiplexer to select the output of the processor element;
the fourth selection signal causes the fourth multiplexer to select the output of the local memory;
the fifth selection signal causes the fifth multiplexer to select the last entry of the shift register; and
the fifth selection signal causes the sixth multiplexer to select the output of the fourth multiplexer.

23. The simulation processor of claim 19, wherein during a store mode of the processor element during which the output of the processor element is input to the local memory:
the first selection signal causes the first multiplexer to refresh the shift register;
the fourth selection signal causes the fourth multiplexer to select the output of the processor element;
the fifth selection signal causes the fifth multiplexer to select the last entry of the shift register; and
the fifth selection signal causes the sixth multiplexer to select the output of the fourth multiplexer.

24. The simulation processor of claim 1, wherein every one of the plurality of processor units includes:
a processor element configurable to simulate at least one of the logic gates; and
a shift register associated with the processor element and including a plurality of entries to store intermediate values during operation of the processor element, the shift register coupled to receive an output of the processor element.

25. The simulation processor of claim 1, wherein every one of the plurality of processor units are identical.

26. The simulation processor of claim 1, wherein the simulation processor is implemented on a board that is pluggable into a host computer.

27. The simulation processor of claim 26, wherein the simulation processor has direct access to a main memory of the host computer.

28. The simulation processor of claim 1, wherein the interconnect system comprises a crossbar.

29. A VLIW processor for performing logic computations, comprising:
- an interconnect system; and
- a plurality of processor units communicatively coupled to each other via the interconnect system, wherein each of at least two of the processor units includes:
  - a processor element configurable to implement at least a portion of the logic computations;
  - a shift register associated with the processor element and including a plurality of entries to store intermediate values during operation of the processor element, the shift register coupled to receive an output of the processor element and also coupled to transfer intermediate values to the interconnect system; and
  - one or more multiplexers coupled between the shift register and the interconnect system, each such multiplexer for selecting one of the entries of the shift register in response to a selection signal and further for transferring the selected entry to the interconnect system, and
- wherein the output of the processor element is coupled to the shift register without an intervening latch, and the shift register is coupled to the interconnect system with an intervening latch.

* * * * *